United States Patent
Peng et al.

(10) Patent No.: US 7,813,389 B2
(45) Date of Patent: Oct. 12, 2010

(54) GENERATING LASER PULSES OF PRESCRIBED PULSE SHAPES PROGRAMMED THROUGH COMBINATION OF SEPARATE ELECTRICAL AND OPTICAL MODULATORS

(75) Inventors: Xiaoyuan Peng, Portland, OR (US); David Barsic, Portland, OR (US); William J. Jordens, Beaverton, OR (US); Qi Wang, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 12/268,203

(22) Filed: Nov. 10, 2008

(65) Prior Publication Data
US 2010/0118899 A1    May 13, 2010

(51) Int. Cl.
H01S 3/30    (2006.01)
H01S 3/10    (2006.01)
H01S 3/13    (2006.01)

(52) U.S. Cl. .................................. 372/26; 372/8; 372/30
(58) Field of Classification Search .................... 372/8, 372/26, 30
See application file for complete search history.

(56) References Cited

U.S. PATENT DOCUMENTS

| 6,281,471 | B1 | 8/2001 | Smart |
| 7,348,516 | B2 | 3/2008 | Sun et al. |
| 2005/0036525 | A1* | 2/2005 | Liu .............................. 372/6 |
| 2006/0159138 | A1 | 7/2006 | Deladurantaye et al. |
| 2009/0245301 | A1* | 10/2009 | Peng et al. ..................... 372/25 |
| 2009/0323741 | A1 | 12/2009 | Deladurantaye et al. |

OTHER PUBLICATIONS

Yunlong Sun, "Laser processing optimization of semiconductor based devices," PhD Dissertation, Oregon Graduate Institute, 1997.

* cited by examiner

*Primary Examiner*—Armando Rodriguez
(74) *Attorney, Agent, or Firm*—Stoel Rives LLP

(57) ABSTRACT

A programmable laser pulse combines electrical modulation of the pulse frequency and optical modulation of the pulse shape to form laser pulses of prescribed pulse shapes. A prescribed pulse shape features high peak power and low average power. The laser system disclosed also allows for power-scaling and nonlinear conversions to other (shorter or longer) wavelengths. The system provides an economical reliable alternative to using a laser source with high repetition rates to achieve shaped pulses at a variety of wavelengths. The combinatorial scheme disclosed is inherently more efficient than existing subtractive methods.

15 Claims, 9 Drawing Sheets

GENERATING LASER PULSES OF PRESCRIBED PULSE SHAPES PROGRAMMED THROUGH COMBINATION OF SEPARATE ELECTRICAL AND OPTICAL MODULATORS

COPYRIGHT NOTICE

© 2008 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71 (d).

TECHNICAL FIELD

The present disclosure relates to pulsed fiber lasers and solid-state laser amplifiers from which tailored laser pulses propagate for use in laser micromachining applications and, in particular, to a highly efficient laser pulse-shaping generator emitting tailored laser pulses with prescribed pulse shapes programmed through a combination of separate electrical and optical modulators.

BACKGROUND INFORMATION

After manufacture of a semiconductor memory array chip is complete, integrated circuit (IC) patterns on an exposed surface of the chip are sealed with an electrically insulating layer of passivating material. Typical passivating materials include resins or thermoplastic polymers such as, for example, polyimide. The purpose of this final "passivation" layer is to prevent the surface of the chip from reacting chemically with ambient moisture, to protect the surface from environmental particulates, and to absorb mechanical stress. Following passivation, the chip is mounted in an electronic package embedded with metal interconnects that allow probing and functional testing of the memory cells. When one of many redundant memory cells is determined to be faulty, the cell is disabled by severing the conductive interconnects, or wires, linking that cell to its neighbors in the array. Disabling individual memory cells by "link processing" or "link blowing" is accomplished by laser micromachining equipment that is capable of directing laser beam energy so as to selectively remove the link material in a highly localized region without imparting damage to the materials adjacent to, below, or above the target. Selectively processing a designated link may be achieved by varying the laser beam wavelength, spot size, pulse repetition rate, pulse shape, or other spatial or temporal beam parameters that influence energy delivery.

Laser micromachining processes that entail post-processing of conductive links in memory arrays or other types of IC chips use sharp pulses with a fast rising front edge (e.g., with a 1-2 ns rise time) to achieve desired quality, yield, and reliability. To cleanly sever a conductive link, the laser pulse penetrates the overlying passivation layer before cutting through the metal interconnect. The rising edge of a typical pulse from an existing solid state laser varies with pulse width. Use of a traditional Gaussian-shaped laser pulse having a 5-20 ns pulse width and a sloped, gradually rising front edge in link processing tends to cause an "over crater" in the passivation layer, especially if its thickness is too large or is uneven.

Rupture behavior of overlying passivation layers has been well analyzed by Yunlong Sun in his PhD dissertation entitled, "Laser processing optimization of semiconductor based devices" (Oregon Graduate Institute, 1997). Because passivation layer thickness is an important parameter, the optimal thickness of a particular passivation layer material may be determined by simulations based on Sun's analysis. Difficulty in maintaining wafer-level process control of the passivation layer during IC fabrication may result in non-optimal thickness and poor cross-wafer or wafer-to-wafer thickness uniformity. Therefore, optimizing characteristics of laser pulses used in post-processing may help to compensate for mis-targeted dimensions and sources of variation in the passivation layer.

U.S. Pat. No. 6,281,471 of Smart proposes using substantially square-shaped laser pulses for link processing. Such a sharp-edged pulse may be generated by coupling a master oscillator laser with a fiber amplifier (MOPA). This low power master oscillator employs a diode laser that is capable of generating a square-shaped pulse with a fast rise time. On the other hand, in U.S. Pat. No. 7,348,516 of Yunlong Sun et al., which patent is assigned to the assignee of this patent application, states that, despite a vertical rising edge, a substantially square-shaped laser pulse is not the best laser pulse shape for link processing. Instead, Sun, et al. describes use of a specially tailored laser pulse shape that, in one embodiment, resembles a chair, with a fast rising peak or multiple peaks to most effectively process links, followed by a drop-off in signal strength that remains relatively flat at a lower power level before shutting off. Such a tailored laser pulse, with high peak power but low average power, has been successfully generated by what is called pulse slicing technology, which can be implemented by either electro-optical modulation (EOM) or acousto-optical modulation (AOM). For example, a conventional active Q-switched solid state laser provides nanosecond seed pulses with high intensity and high pulse energy, and then a light-loop slicing device transforms a standard laser pulse into a desired tailored pulse shape.

It is possible to obtain high efficiency and high peak power output directly from laser diodes. In other words, it is possible to generate high peak power and high pulse energy using exclusively electrically modulated seed pulses. The simplicity of this scheme is advantageous, and it also may be implemented with fewer amplifier stages. However, the center wavelength of the semiconductor diode tends to drift with small changes in temperature resulting from the change in pulse shape, which temperature drift may adversely affect downstream solid-state amplifiers and harmonic generation.

Alternatively, a specially tailored laser pulse may be generated by a MOPA that employs a gain fiber as the power amplifier. Using a MOPA is advantageous in that it constitutes a stable signal source at a specified constant frequency.

U.S. Patent Application No. 2006/0159138 of Pascal Deladurantaye describes a shaped-pulse laser in which two modulators shape a continuous wave (CW) light beam to generate various shaped pulses. However, generating a pulsed laser from a CW light beam is fairly inefficient, and thus requires more amplification. Because such a low peak-power signal may be influenced by noise, which causes pulse-to-pulse instability, the two modulators are preferably synchronized to maintain pulse stability and energy stability, thereby adding further complexity and cost.

SUMMARY OF THE DISCLOSURE

A programmable laser pulse-shaping generator combines electrical modulation of laser pulse frequency with optical modulation of laser pulse shape to produce tailored laser pulses of a prescribed shape with pulse widths on the order of a few nanoseconds to tens of nanoseconds and fast rise times on the order of a few nanoseconds to less than a nanosecond. A preferred laser pulse-shaping generator includes a modulated pulsed laser source in the form of a seed laser diode, which has as its input a frequency-modulated electrical signal. The system produces a series of high power tailored laser pulses that are shaped by a high speed optical modulator and optical power amplifiers. The pulse-shaping generator allows for power-scaling and generating harmonics at shorter wavelengths and provides an economical, reliable alternative to using a laser source operating at high repetition rates to achieve shaped pulses at a variety of wavelengths. The combinatorial scheme implemented by the pulse-shaping generator is inherently more efficient than existing subtractive methods that form a tailored pulse by optically slicing a seed pulse.

Additional aspects and advantages will be apparent from the following detailed description of preferred embodiments, which proceeds with reference to the accompanying drawings.

BRIEF DESCRIPTION OF THE DRAWINGS

FIG. 1 also shows, at outputs of certain pulse-shaping generator components, the temporal profiles of laser pulses formed at various stages of development of the tailored pulse produced.

DETAILED DESCRIPTION OF PREFERRED EMBODIMENTS

Figure 1:
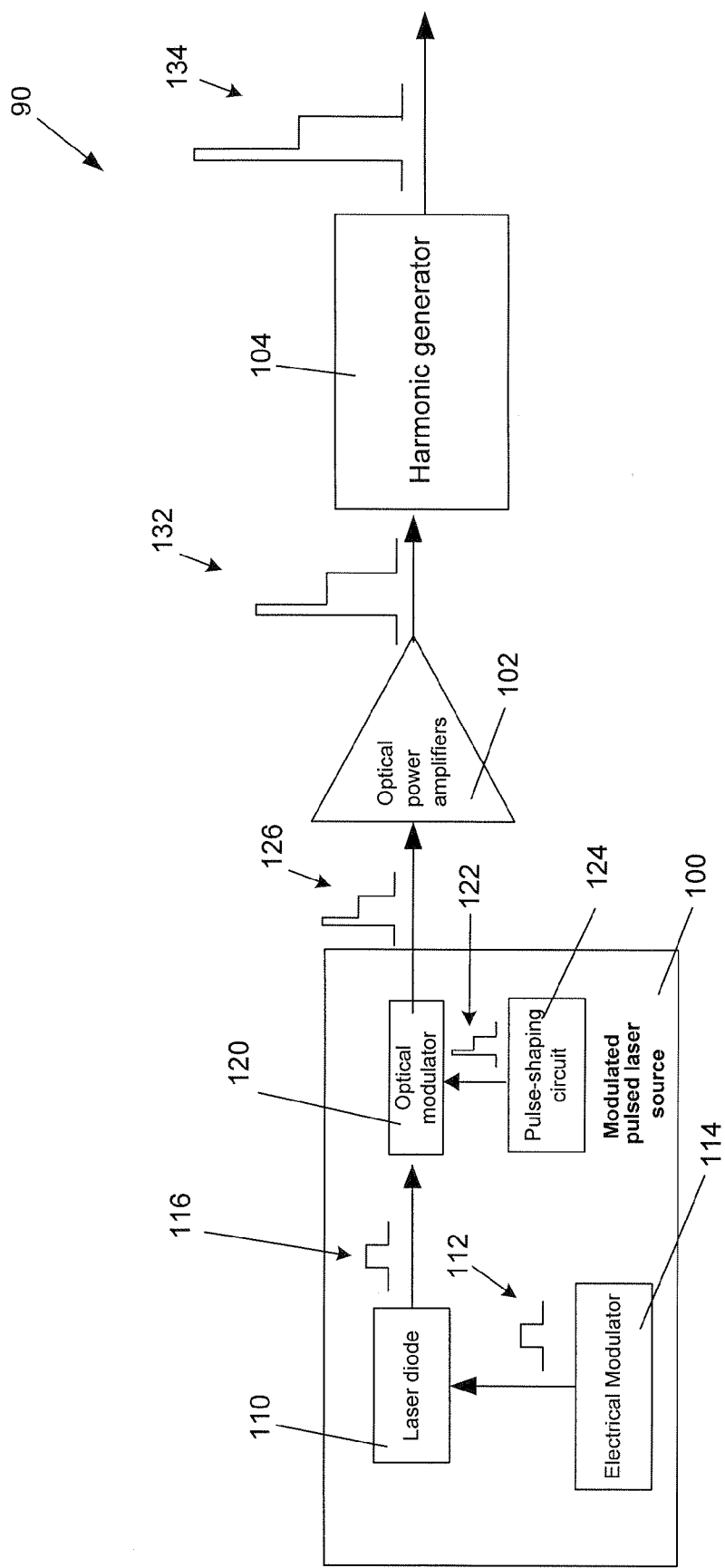
FIG. 1 is a block diagram showing the components of a laser pulse-shaping generator capable of producing a tailored pulse by a combination of electrical and optical modulations.

FIG. 1 shows a laser pulse-shaping generator 90 with the desired operating and performance characteristics discussed above. Pulse-shaping generator 90 is constructed of a modulated pulsed laser source 100 that produces a prescribed tailored laser pulse for amplification by a set of optical power amplifiers 102 and for wavelength conversion by a harmonic generator 104.

Modulated pulsed laser source 100, such as a semiconductor laser, is preferably composed of a high-speed distributed feedback (DFB) seed laser diode 110 that is modulated by a seed pulse signal 112 produced by an electrical modulator 114 to provide at a high repetition rate a series of seed laser pulses 116. In a preferred implementation, seed pulse signal 112 represents a series of seed pulses 116. An optical modulator 120 receives and, in response to gating electrical control signal pulses 122 that are produced by a high-speed programmable pulse-shaping circuit 124 and are synchronized to seed pulse signal 112, modulates seed laser pulses 116 to produce a series of prescribed laser pulses 126. Optical modulator 120 and pulse-shaping circuit 124 cooperate to reconfigure each of seed laser pulses 116 to the desired temporal profile of laser pulse 126 for optimal material processing.

Optical power amplifiers 102 produce amplified tailored laser pulses 132 that are generally faithful replicas of tailored laser pulses 126. Harmonic generator 104 converts amplified tailored laser pulses 132 to output laser pulses 134 in a different wavelength range, such as green, ultraviolet (UV), or deep ultraviolet (DUV), and, as a consequence of the nonlinear conversion process, with an accentuated tailored pulse profile.

Skilled persons will appreciate that a Q-switched solid state laser pulse source or fiber laser source could be substituted for semiconductor seed laser 110, but the latter is preferred because of the following advantages. Laser pulse-shaping generator 90 configured with DFB seed laser diode 110 offers wide tunability and narrow linewidth in a compact, rugged setup. Such DFB seed laser diode 110 equipped with polarization maintaining (PM) fiber couplers (not shown) may be obtained from Toptica Photonics, AG of Munich, Germany.

Figure 2:
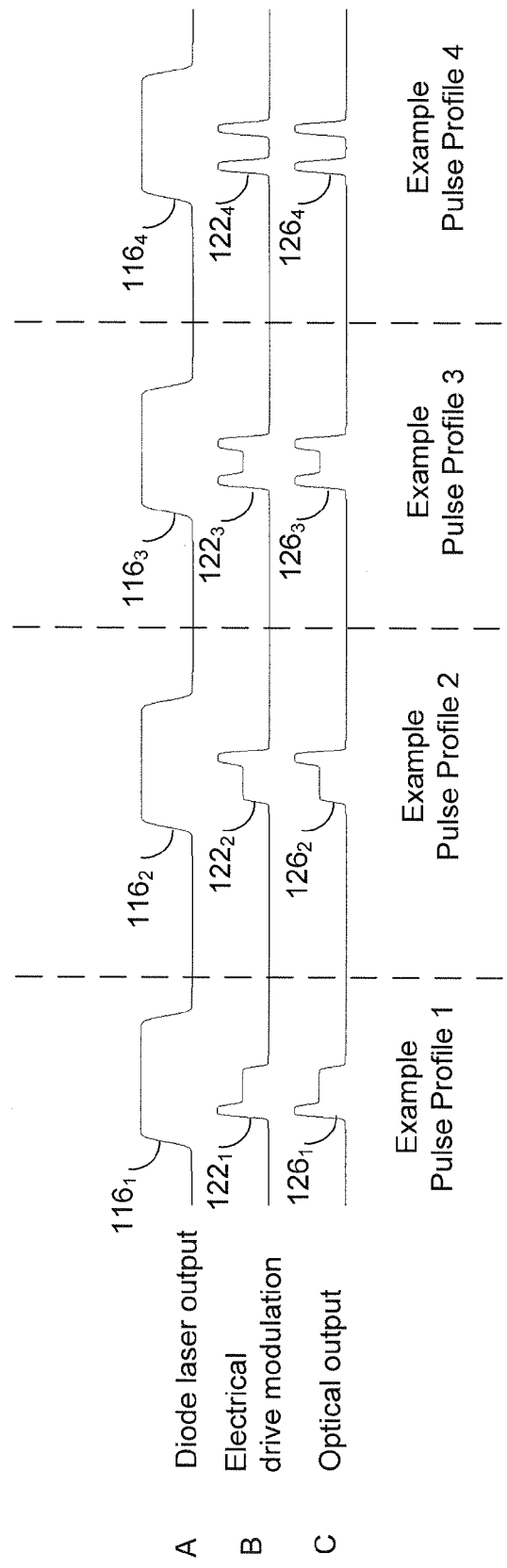
FIG. 2 presents a set of three waveform diagrams of diode laser output, pulse-shaping circuit output for electrical drive modulation, and optical output of a modulated pulsed laser source of the pulse-shaping generator of FIG. 1, the three waveforms exhibiting corresponding pulse shapes formed in the production of four examples of tailored laser pulse profiles.

FIG. 2 shows three waveform diagrams that present four examples (separated by dashed vertical lines) of the formation of different tailored laser pulse profiles produced at the output of optical modulator 120 (and modulated pulsed laser source 100). FIG. 2, line A represents a series of four similar seed laser pulses $116_1$, $116_2$, $116_3$, and $116_4$ emitted by laser diode 110. FIG. 2, line B represents four different gating control signal pulses $122_1$, $122_2$, $122_3$, and $122_4$ of programmable pulse-shaping circuit 124; and FIG. 2, line C represents four different tailored laser pulses $126_1$, $126_2$, $126_3$, and $126_4$ of optical modulator 120 to which the respective gating control signal pulses $122_1$, $122_2$, $122_3$, and $122_4$ correspond. (The reference numerals of the seed laser pulses and gating control signal pulses contributing to a same one of the examples of the tailored laser pulses share common subscripts.)

In each of the four examples, a gating control signal pulse modulates a seed laser pulse to form a tailored laser pulse, the shape of which is a substantially faithful replica of the shape of the gating control signal pulse. Tailored laser pulses $126_1$, $126_2$, $126_3$, and $126_4$ represent, respectively, chair-, reverse chair-, double peak-, and double spike-shaped laser pulses, each of which provides a high peak power level and a low average power level.

Figure 3A:
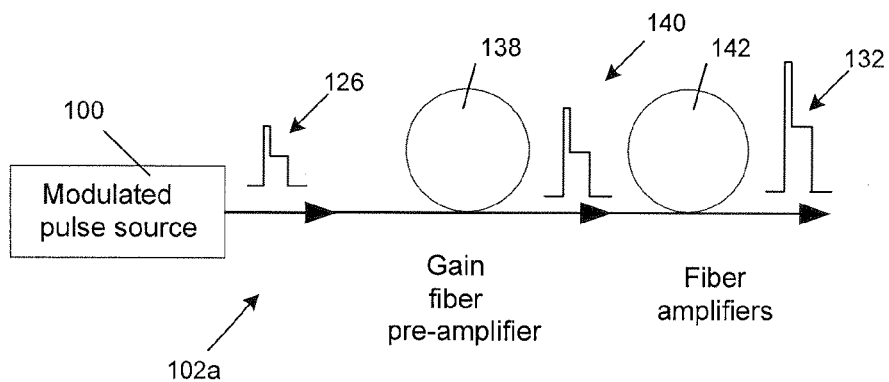
FIGS. 3A, 3B, and 3C are schematic diagrams showing three gain fiber pre-amplifier and output amplifier configurations for use with the modulated pulsed laser source of FIG. 1.
Figure 3B:
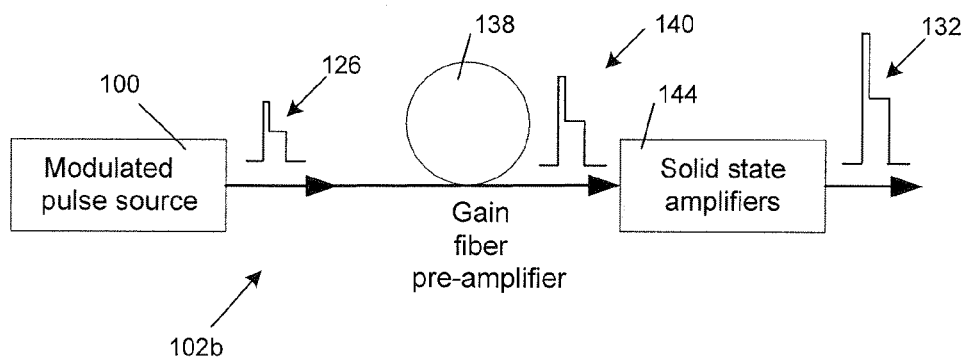
Figure 3C:
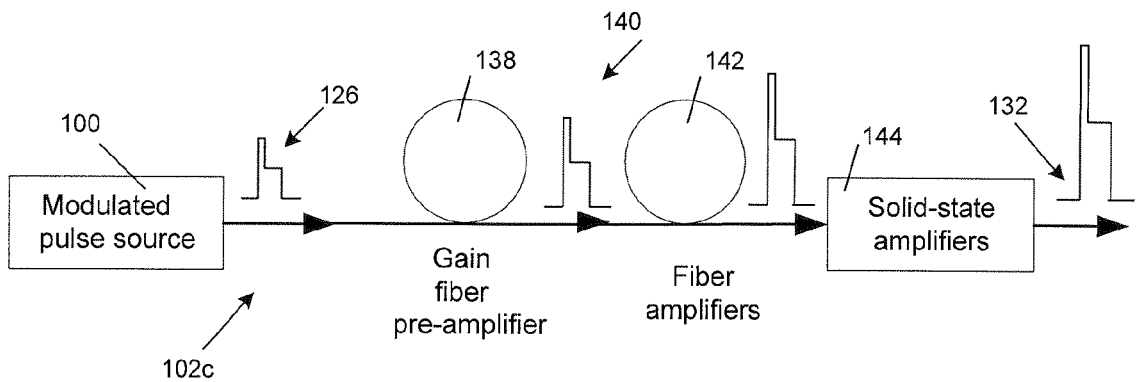

FIGS. 3A, 3B, and 3C show respective alternative embodiments 102a, 102b, and 102c implementing different configurations of optical power amplifiers 102 that are suitable for amplifying tailored laser pulses 126 appearing at the output of optical modulator 120. Modulated pulsed laser source 100 produces at its output laser pulses 126 of any one of a variety of pulse shapes (as demonstrated in FIG. 2, line C). Each embodiment 102a, 102b, and 102c includes a gain fiber pre-amplifier 138 that contains optical gain fibers such as Ytterbium (Yb), Erbium (Er), or Neodymium (Nd) glass to produce an intermediate shaped laser pulse 140 with increased peak power. Amplifier stages may be added to produce at least 1 kW of peak power output. Embodiments 102a, 102b, and 102c employ as amplifier stages fiber amplifiers 142, solid state amplifiers 144, or a combination of both of them, respectively, to produce a high power amplified tailored laser pulse 132. FIG. 3A presents a simple and efficient all-fiber optic configuration (without any solid state components) that may, however, be subject to damage and some undesired nonlinear effects under high peak power operation with a single mode, polarized laser. FIGS. 3B and 3C present two hybrid or "tandem" configurations that are more robust at peak power levels greater than 1 kW because they include solid state amplifiers 144. By programmable pulse shaping and successive amplification, high peak power amplified, prescribed laser pulse 132 may thus be constructed gradually, by progressively building a desired pulse shape and accumulating a desired power output in a combinatorial fashion. Such gradual building of a pulse shape and accumulating laser output power constitute an inherently more efficient process than generating a high power pulse and selectively subtracting or absorbing energy to achieve a desired pulse shape.

Figure 4:
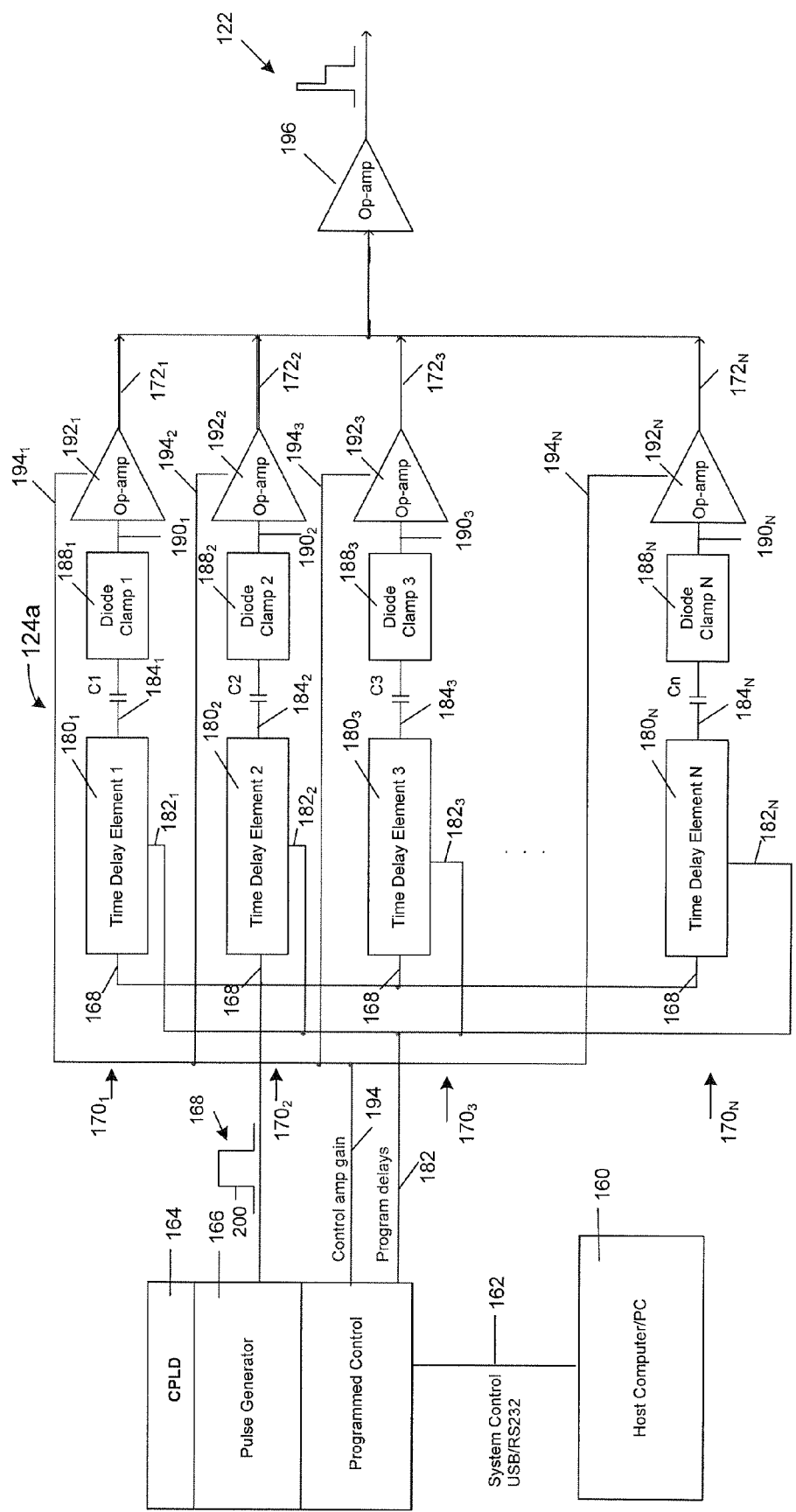
FIG. 4 is a block diagram showing the electrical circuit components of an analog implementation of the programmable pulse-shaping circuit of FIG. 1.

FIG. 4 is a block diagram showing the electrical components of an analog implementation 124a of programmable pulse-shaping circuit 124 in greater detail. Electrical signal waveforms produced at intermediate stages within pulse-shaping circuit 124a of FIG. 4 are shown and identified with corresponding reference numerals in FIG. 5. Electrical modulator 114 drives DFB seed laser diode 110 to produce seed laser pulses 116, as described above with reference to FIG. 1. A host control computer or microcontroller 160 provides on a universal serial bus (USB), R232, or similar external data bus connection 162 signals that coordinate and control the operation of a Complex Programmable Logic Device (CPLD) 164. A suitable CPLD is an Altera Max II EPM240T100C3N, which is available from Altera Corporation, San Jose, Calif. Host control computer 160 coordinates the operations of electrical modulator 114 and pulse shaping circuit 124 so that seed pulse signal 112 and gating control signal pulses 122 are in synchronism. CPLD 164 includes an internal pulse generator 166 that produces a series of square pulses 168. Pulses 168 are applied to the inputs of N number of delay line circuits 170 (four shown in FIG. 4) to produce time-displaced, conditioned output pulses 172 that are combined to form electrical control signal 122.

All of the N number of delay line circuits 170 are nominally the same and are identified by reference numeral 170 and a different one of subscripts 1, 2, 3, ..., N. Corresponding components of delay line circuits 170 share common reference numerals with a subscript identifying the delay line circuit in which the components reside. The following description of the construction and operation of an individual delay line circuit is directed, therefore, to only delay line circuit $170_1$. Delay line circuit $170_1$ includes a programmable time delay element $180_1$, having a signal input that receives square pulses 168 and a delay time input that receives a time delay control signal $182_1$ from CPLD 164 to produce a delayed pulsed signal $184_1$. A suitable programmable time delay element $180_1$ is a DS 1020, which is available from Maxim Integrated Products, Inc., of Sunnyvale, Calif. A capacitor $C_1$ blocks the direct current (DC) portion of delayed pulsed signal $184_1$, thereby producing signal pulses with positive- and negative-going voltage portions. A diode clamp circuit $188_1$ blocks the negative-going voltage portions to provide a series of peaked pulses $190_1$. A gain-controllable operational amplifier $192_1$ has a signal input that receives peaked pulses $190_1$ and a gain control input that receives a gain control signal $194_1$ from CPLD 164 to produce a series of output pulses $172_1$ of programmable voltage levels.

A suitable high bandwidth, fast slew rate operational amplifier 192 is a THS3201, which is available from Texas Instruments of Dallas, Tex. and features a 2.2 GHz bandwidth at unity gain. Suitable alternative operational amplifiers include a digital programmed differential amplifier LMH6518, which is available from National Semiconductor of Santa Clara, Calif. and features an 825 MHz bandwidth and a 500 picosecond rise/fall time.

Figure 5:
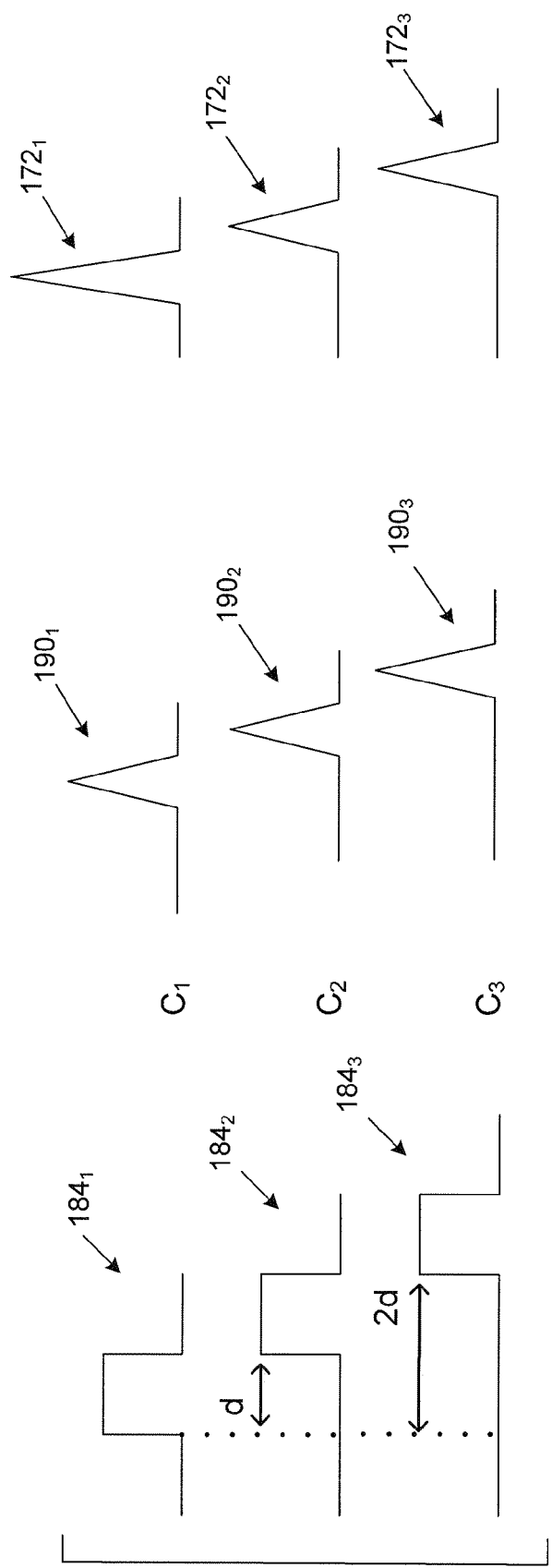
FIG. 5 is a waveform diagram showing pulse shapes of electrical signals that correspond to different stages of the programmable pulse-shaping circuit of FIG. 4.

The N number of delay line circuits 170 is programmed to produce time-delayed peaked pulses $172_1$-$172_N$ that are combined by a summing operational amplifier 196 to form gating electrical control signal 122 of the desired shape. More specifically, time delay control signals $182_1$-$182_N$ applied to their respective programmable time delay elements $180_1$-$180_N$ impart programmed amounts of delay relative to leading edges 200 of square pulses 168 to produce delayed pulse signals $184_1$-$184_N$. The delay amounts imparted enable formation of a desired composite wave shape of gating electrical control signal 122. FIG. 5 shows as an example a sequence of delayed pulse signals $184_1$, $184_2$, and $184_3$ that represent zero, one delay unit, d, and two delay units, 2d, imparted by their corresponding time delay control signals $182_1$, $182_2$, and $182_3$. The zero, one delay unit, d, and two delay units, 2d, imparted produce a sequence of temporally nonoverlapping delayed pulse signals $184_1$, $184_2$, and $184_3$ that are progressively delayed by a uniform amount, as illustrated. A realizable delay unit, d, is 0.15 ns, for example. Diode clamp circuits $188_1$, $188_2$, and $188_3$ produce the respective peaked pulses $190_1$, $190_2$, and $190_3$, as illustrated. Each of operational amplifiers $192_1$-$192_N$ features a fast slew rate and broad bandwidth to amplify its associated one of peaked pulses $190_1$-$190_N$ to a different, separately programmable, voltage level. Thus, for the example of FIG. 5, first pulse $190_1$ may be amplified more than subsequent pulses $190_2$ and $190_3$, as illustrated. Such differential amplification produces a leading high energy peak $172_1$ that, upon combination with the subsequent time-displaced amplified peaked pulses $172_2$ and $172_3$, forms the back of the "chair" of resultant gating electrical control signal 122 of the type shown as Example Pulse Profile 1 in FIG. 2.

Two methods of programming pulse-shaping circuit 124a of FIG. 4 may be used either separately or in combination to specify different tailored shapes such as those of gating electrical control signal pulses $122_1$, $122_2$, $122_3$, and $122_4$ of FIG. 2, line B. A first method entails specifying fixed gain values of operational amplifiers 192 so that each of them has a binary weighted gain value. In this case, time delay elements 180 would simply be pre-programmed by time delay control signal 182 to different values to form a new prescribed electrical control signal pulse shape. A second method entails using a time delay element 180 programmed to a fixed delay value and controlling the gain level of each operational amplifier 192 by its associated gain control signal 194 to achieve a desired prescribed electrical control signal pulse shape. Alternatively, a combination of the two programming methods may be used.

Figure 6:
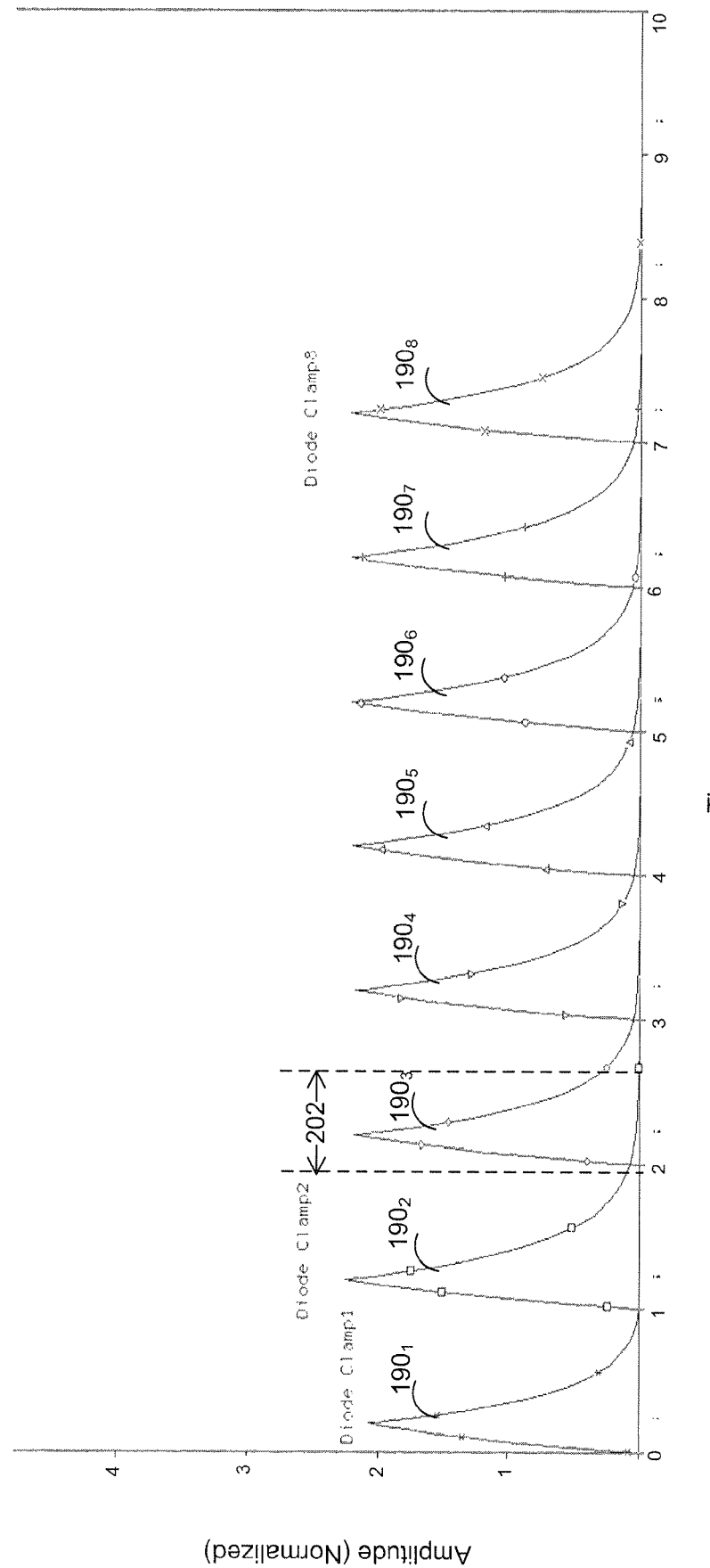
FIG. 6 is a simulated high resolution (1 ns) pulse train output from the diode clamp circuitry of the programmable pulse-shaping circuit of FIG. 4.

If the desired temporal pulse width of electrical control signal pulses 190 is longer than the time delay between them, or if operational amplifiers 192 overshoot or undershoot the target power level, adjacent pulse overlap results, as indicated by overlap 202 between peaked pulses $190_2$ and $190_3$ in FIG. 6. It is therefore preferable to custom-adjust delay times programmed in time delay elements 180 or amplifier gain values set in operational amplifiers 192 to achieve the prescribed electrical control signal pulse shape, and it is desirable to choose values of capacitors $C_1, \ldots, C_N$ that allow for shorter pulse durations to maximize accuracy.

Figure 7:
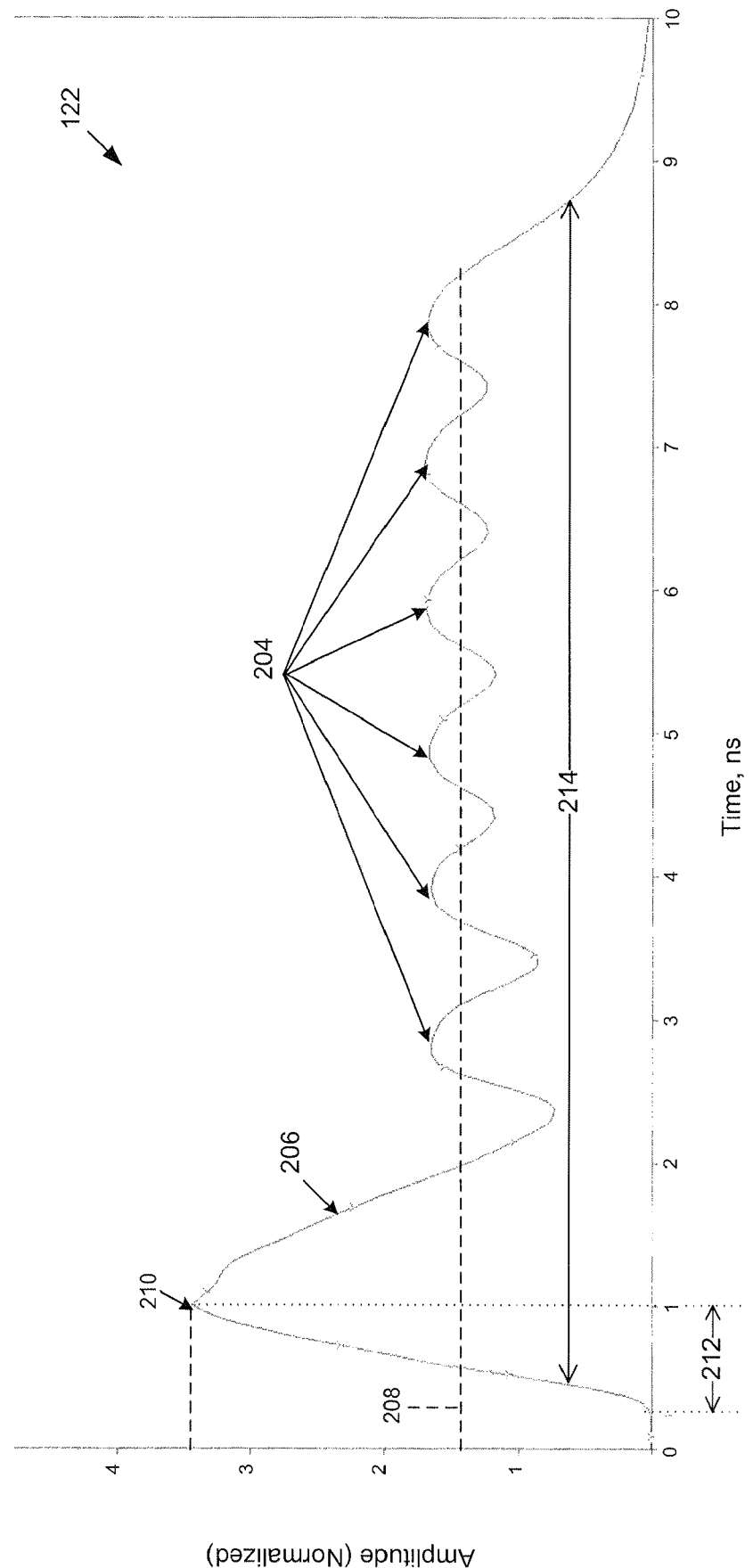
FIG. 7 is a plot of a 1 ns resolution, gating electrical control signal pulse constructed by the programmable pulse-shaping circuit of FIG. 4, in which the shape of the gating electrical control signal pulse approximates that of a desired "chair" tailored laser pulse profile.

Electrical control signal 122 shown in greater detail in FIG. 7 represents the sum of output pulses $172_1, \ldots, 172_N$ that appears at the output of summing operational amplifier 196 and approximates the prescribed "chair" shape of control signal 122₁ shown in FIG. 2, line B. A "ringing" produced by trailing pulses 204 following the leading peak pulse 206 averages to a low power value 208. A high peak power 210 of leading peak pulse 206 has a short rise time 212 on the order of 1 ns, as compared with an overall pulse width 214, which is on the order of 10 ns. Referring again to FIG. 1, electrical control signal 122 generated by pulse-shaping circuit 124 modulates seed laser pulse 116 to form tailored laser pulse 126 at the output of optical modulator 120. The set of high bandwidth optical power amplifiers 102 then amplifies tailored laser pulse 126 to produce high powered tailored laser output pulse 132, having a shape that faithfully represents that of the prescribed tailored laser pulse 126.

Figure 8:
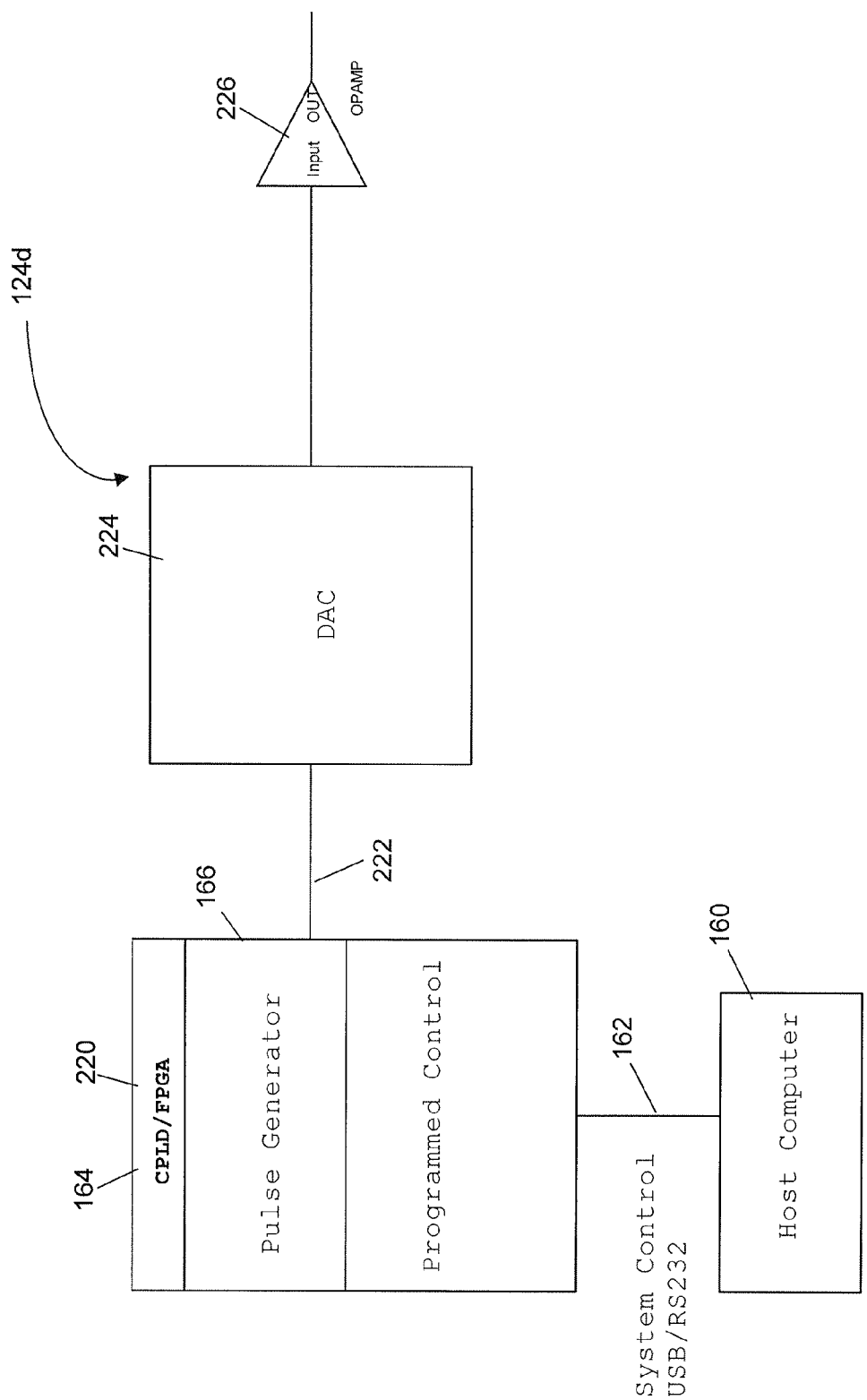
FIG. 8 is a block diagram showing the electrical circuit components of a digital implementation of the programmable pulse-shaping circuit of FIG. 1.

FIG. 8 is a block diagram showing the electrical components of an alternative, digital implementation of programmable pulse-shaping circuit 124. Alternative, digital implementation 124*d* includes programmable digital pulse-shaping circuitry as a substitute for the programmable time delay elements 180, diode clamp circuits 188, and operational amplifiers 192 of the analog implementation of FIG. 4. The programmable digital pulse-shaping circuitry includes a high speed field programmable gate array (FPGA) 220, such as a Xilinx Virtex 5, available from Xilinx, Inc., San Jose, Calif., for generating a stream of binary data 222 specifying a desired tailored pulse shape such as the chair example used in the analog implementation described above. FPGA 220 is shown in FIG. 8 in combination with CPLD 164. Stream of binary data 222 appearing at the output of FPGA 220 is applied to the input of a digital-to-analog converter (DAC) 224, which produces at its output an analog control signal that has the shape of electrical control signal 122. A suitable DAC 224 is a DAC 5681, available from Texas Instruments, Inc., Dallas, Tex. The output of DAC 224 is applied to the input of an operational amplifier 226, at the output of which electrical control signal 122 appears.

The analog implementation of FIG. 4 is simpler in that it has fewer component parts than the number of them in the digital implementation of FIG. 8. Both of the circuits of FIGS. 4 and 8 have strict requirements in the circuit layout so that the data arrive at the same time or a prescribed delay with respect to the other signals. At this time, the delay line-based circuit of FIG. 4 has greater resolution, but it is expected that faster DACs will be available in the near future.

Figure 9:
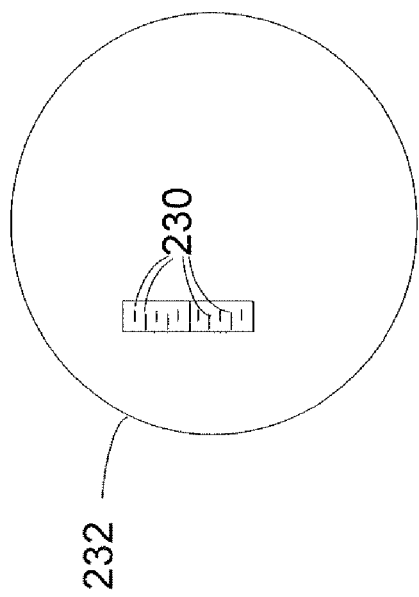
FIG. 9 is a diagram showing a semiconductor wafer having semiconductor link structures on its work surface.

An illustrative example of a useful application of output laser pulses 134 having a tailored temporal profile is the severing of semiconductor link structures 230 on a wafer specimen 232, which is shown in FIG. 9.

It will be obvious to those having skill in the art that many changes may be made to the details of the above-described embodiments without departing from the underlying principles of the invention. The scope of the present invention should, therefore, be determined only by the following claims.

The invention claimed is:

1. A highly efficient dynamic laser pulse-shaping generator emitting laser pulses with prescribed pulse shapes programmed through a combination of separate electrical and optical modulators, the prescribed pulse shapes exhibiting temporal features, comprising:

a laser source driven by an electrical modulator to emit a pulsed laser output at a pulse repetition rate;

a programmable electrical pulse-shaping circuit producing an electrical control signal and including a pulse generator cooperating with multiple time delay lines to develop a series of time-displaced pulses, a controller operatively connected to the multiple delay lines to select an amount of delay for each of the time-displaced pulses in the series, and a pulse combiner receiving and combining the time-displaced pulses to synthesize the electrical control signal ;and an optical modulator receiving the pulsed laser output and cooperating with the programmable electrical pulse-shaping circuit to generate multiple laser output pulses in response to the electrical control signal, the electrical control signal being programmed to a temporal shape that establishes the prescribed pulse shape of each of the multiple laser output pulses generated by the optical modulator.

2. The pulse-shaping generator of claim 1, in which the programmable electrical pulse-shaping circuit further comprises circuit elements that contribute to formation of the temporal features exhibited by the electrical control signal.

3. The pulse-shaping generator of claim 2, in which the circuit elements impart amplitude adjustment of the time-displaced pulses in the series to contribute to the formation of the temporal features.

4. The pulse-shaping generator of claim 3, in which the controller provides gain control signals and the circuit elements include gain programmable operational amplifiers that receive the gain control signals to set gain values of the operational amplifiers and thereby perform amplitude adjustment of the time-displaced pulses in the series.

5. The pulse-shaping generator of claim 2, in which the circuit elements impart phase adjustment of the time-displaced pulses in the series to contribute to the formation of the temporal features.

6. The pulse-shaping generator of claim 5, in which the controller provides time delay control signals and the circuit elements include time delay elements that receive the time delay control signals to set time delay values of the time delay elements and thereby perform phase adjustment of the time-displaced pulses in the series.

7. The pulse-shaping generator of claim 1, further comprising optical power amplifiers that include, in combination, gain fiber pre-amplifiers, and one or both of fiber amplifiers and solid state amplifiers, assembled to provide peak powers of at least 1 kW in the multiple laser output pulses.

8. The pulse-shaping generator of claim 7, in which the gain fiber pre-amplifier includes Yb, Er, or Nd glass type of optical fiber.

9. The pulse-shaping generator of claim 1, in which the multiple laser output pulses of prescribed pulse shapes are emitted at a first wavelength, and further comprising a harmonic generator optically associated with the optical modulator to shift the multiple laser output pulses of prescribed pulse shapes to a second wavelength.

10. The pulse-shaping generator of claim 9, in which the second wavelength is shorter than the first wavelength.

11. The pulse-shaping generator of claim 1, in which the laser source includes a semiconductor laser.

12. The pulse-shaping generator of claim 1, in which the laser source includes a pulsed fiber laser.

13. The pulse-shaping generator of claim 1, in which the laser source includes a Q switched solid state laser.

14. The pulse-shaping generator of claim 1, in which the prescribed pulse shape has a rising front edge within a range of 1 ns -3 ns and a pulse width within a range of 1 ns -100 ns.

15. The pulse-shaping generator of claim 1, in which the laser output pulses are directed to cut links in a semiconductor device.

* * * * *